US005291460A

United States Patent [19]

Harada et al.

[11] Patent Number: 5,291,460

[45] Date of Patent: Mar. 1, 1994

[54] PIEZOELECTRIC SOUNDING BODY

[75] Inventors: Jun Harada; Manabu Sumita; Shunjiro Imagawa, all of Nagaokakyo, Japan

[73] Assignee: Murata Manufacturing Co., Ltd., Japan

[21] Appl. No.: 961,444

[22] Filed: Oct. 15, 1992

[30] Foreign Application Priority Data

Oct. 15, 1991 [JP] Japan ................................. 3-266073

[51] Int. Cl.[5] ............................................. H01L 41/04

[52] U.S. Cl. .................................... 367/140; 310/324; 310/348; 381/190

[58] Field of Search ................ 310/324, 348; 367/140; 381/173, 190; 523/176

[56] References Cited

U.S. PATENT DOCUMENTS

| | | | |
|---|---|---|---|
| 3,970,879 | 7/1976 | Kumon | 310/324 |
| 4,234,711 | 11/1980 | Emmons et al. | 523/176 |
| 4,368,401 | 1/1983 | Martin et al. | 310/324 |
| 4,533,446 | 8/1985 | Conway et al. | 523/176 |
| 4,734,174 | 3/1988 | Venis, Jr. | 204/129.5 |

FOREIGN PATENT DOCUMENTS 62-62699 3/1987 Japan .

*Primary Examiner*—Ian J. Lobo

*Attorney, Agent, or Firm*—Ostrolenk, Faber, Gerb & Soffen

[57] ABSTRACT

Disclosed herein is a piezoelectric sounding body comprising a piezoelectric substrate, an electrode film provided on its surface and a vibrating plate provided on the electrode film through an adhesion layer so as to conduct with the electrode film. The adhesion layer is prepared from an ultraviolet setting type anaerobic adhesive containing 0.1 to 1.0 percent by weight of carbon particles of 1.0 to 20.0 μm in mean particle diameter.

11 Claims, 1 Drawing Sheet

PIEZOELECTRIC SOUNDING BODY

BACKGROUND OF THE INVENTION

1. Field of the Invention

The present invention relates to a piezoelectric sounding body, which comprises a piezoelectric substrate and a vibrating plate mounted thereon.

2. Description of the Background Art

FIG. 2 is a side elevational view showing the structure of a piezoelectric sounding body, which comprises a piezoelectric substrate and a vibrating plate mounted thereon. Referring to FIG. 2, a piezoelectric substrate 1 of the piezoelectric sounding body is provided on both surfaces with electrode films 2*a* and 2*b*, respectively, which are mainly made by baking a layer of silver. A vibrating plate 3 made of a metal is stuck onto the electrode film 2*b*, which is formed on a lower surface of the piezoelectric substrate 1, through an adhesion layer 10. The adhesion layer 10 is thermocompression-bonded so as to stick the vibrating plate 3 onto the electrode film 2*b* which is provided on the surface of the piezoelectric substrate 1.

In general, the vibrating plate 3 is pressed against the electrode film 2*b* so as to be strongly in contact with its irregular surface, so that the vibrating plate 3 is bonded to the electrode film 2*b* through the adhesion layer 10. Thus, the vibrating plate 3 electrically conducts with the electrode film 2*b*.

However, such a conventional piezoelectric sounding body has the following problem:

In the piezoelectric sounding body, the electrode films 2*a* and 2*b* may be formed by a method such as sputtering or vapor deposition. According to such methods of forming electrode films, however, the electrode films 2*a* and 2*b* that are formed have relatively flat surfaces, with small irregularities formed therein. Therefore, even if the vibrating plate 3 is strongly pressed against the electrode film 2*b* through the adhesion layer 10, sufficient contact is not attained between the vibrating plate 3 and the electrode film 2*b* due to the small irregularities formed on the surface of the electrode film 2*b*. Thus, when the piezoelectric sounding body is used for a long time so that the adhesion layer 10 is repeatedly subjected to expansion and contraction, conduction failure can result between the vibrating plate 3 and the electrode film 2*b*.

In order to solve such a problem, the adhesion layer 10 may be prepared from an adhesive having conductivity. In an ordinary conductive adhesive, however, a large amount of conductive powder is dispersed and mixed in the adhesive in order to attain conductivity in both the longitudinal and transverse directions. For example, 80 to 90 percent by weight of silver powder is mixed in such a conductive adhesive. Accordingly sufficient adhesive strength cannot be attained between the adhesion layer 10 and the vibrating plate 3, while the adhesion layer 10 is inevitably increased in thickness thereby deteriorating the resonance characteristic of the piezoelectric sounding body.

SUMMARY OF THE INVENTION

An object of the present invention is to provide a piezoelectric sounding body, which has neither conduction failure between a vibrating plate and an electrode film nor deterioration of the resonance characteristic.

A piezoelectric sounding body according to the present invention comprises a piezoelectric substrate, an electrode film provided on a surface of the piezoelectric substrate, a vibrating plate provided on the electrode film, and an adhesion layer provided between the electrode film and the vibrating plate for allowing electrical conduction between the electrode film and the vibrating plate. The adhesion layer is made of an ultraviolet setting type anaerobic adhesive containing 0.1 to 1.0 percent by weight of carbon particles of 1.0 to 20.0 μm in mean particle diameter.

According to the present invention, the adhesion layer contains conductive carbon particles. When the vibrating plate is compression-bonded to the electrode film through the adhesion layer, therefore, the carbon particles spread between the electrode film and the vibrating plate so as to come into contact with the same, thereby reliably allowing electrical conduction therebetween. According to the present invention, further, the adhesive contains only a small amount of such carbon particles, whereby the adhesion layer can be reduced in thickness so as to exert no influence on the resonance characteristic.

Such a small amount of carbon particles exert only a small influence on the ultraviolet setting property of the ultraviolet setting type anaerobic adhesive forming the adhesion layer. Further, the carbon particles hardly cause sedimentation in the adhesive, since generally the specific gravity thereof is substantially identical to that of the ultraviolet setting type anaerobic adhesive.

According to the present invention, it is possible to reliably allow electrical conduction between the electrode film of the piezoelectric substrate and the vibrating plate through the carbon particles contained in the adhesion layer. Even if the piezozelectric substrate is provided with an electrode film having a smooth surface with small irregularities formed therein by a method such as sputtering or vapor deposition, therefore, the vibrating plate can reliably electrically conduct with the electrode film.

As hereinabove described, the adhesion layer can be extremely reduced in thickness after the vibrating plate is compression-bonded to the electrode film of the piezoelectric substrate through the adhesion layer, due to the extremely small amount of the carbon particles contained therein. Thus, it is possible to prevent the reduction of resonance characteristic caused by increase in thickness of the adhesion layer.

Further, the specific gravity of the carbon particles is substantially identical to that of the ultraviolet setting type anaerobic adhesive as hereinabove described, whereby the carbon particles hardly cause sedimentation in the adhesive. Thus, it is not necessary to stir the ultraviolet setting type anaerobic adhesive for every bonding operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
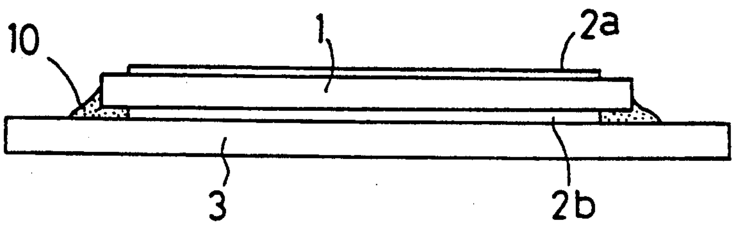
FIG. 2 is a side elevational view showing a general piezoelectric sounding body comprising a piezoelectric substrate and a vibrating plate mounted thereon.

A piezoelectric sounding body according to an embodiment of the present invention also has the basic structure shown in FIG. 2. Referring again to FIG. 2, the structure of this embodiment is now described. The piezoelectric sounding body according to this embodiment comprises a piezoelectric substrate 1 and electrode films 2a and 2b, prepared from Ni sputtering films, which are formed on both surfaces thereof. According to this embodiment, the piezoelectric substrate 1 is prepared from a polarized piezoelectric ceramic substrate. A vibrating plate 3 is provided on a surface of the electrode film 2b, which is formed on the piezoelectric substrate 1, through an adhesive layer 10. According to this embodiment, the vibrating plate 3 is made of brass. The adhesion layer 10 is interposed between the vibrating plate 3 and the electrode film 2b provided on the piezoelectric substrate 1. According to this embodiment, the adhesion layer 10 is made of an adhesive prepared by adding carbon particles into an ultraviolet setting type anaerobic adhesive.

Figure 1:
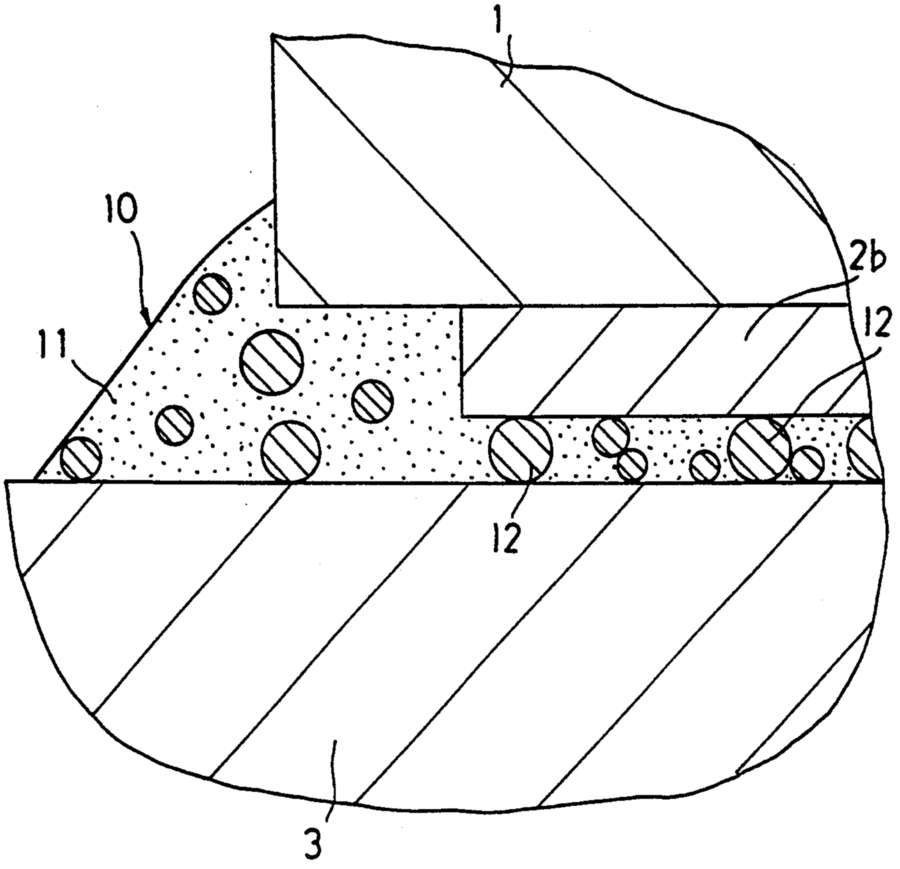
FIG. 1 is an enlarged sectional view showing an embodiment of the present invention.

FIG. 1 is a typical enlarged sectional view showing the state of this adhesion layer 10. Referring to FIG. 1, the adhesion layer 10 is provided between the vibrating plate 3 and the electrode film 2b of the piezoelectric substrate 1. The adhesion layer 10 is prepared from an ultraviolet setting type anaerobic adhesive 11 containing carbon particles 12. When the vibrating plate 3 is strongly pressed against the piezoelectric substrate 1 to be bonded thereto, the adhesion layer 10 is compressed to a thickness which is substantially identical to the particle diameter of the carbon particles 12 contained therein, whereby the carbon particles 12 come into contact with the electrode film 2b and the vibrating plate 3, as shown in FIG. 1. Since the carbon particles 12 are conductive, the vibrating plate 3 electrically conducts with the electrode film 2b due to interposition of such carbon particles 12.

According to this embodiment, the electrode films 2a and 2b are formed by Ni sputtering films. Therefore, the surfaces of the electrode films 2a and 2b are flat so that it is difficult to press the vibrating plate 3 against the same to allow electrical conduction. According to this embodiment, the adhesion layer 10 contains the conductive carbon particles 12, thereby bringing the vibrating plate 3 into contact with the electrode film 2b for allowing electrical conduction therebetween. After the adhesion layer 10 is compression-bonded and set, a portion of the adhesion layer 10 that is forced out beyond the piezoelectric substrate 1 can be set with ultraviolet radiation, which is emitted from an Hg lamp of 80 W/cm, having a dominant wavelength of 365 nm and integrating luminous energy of about 2 J, for example.

The ultraviolet setting type anaerobic adhesive employed in the present invention can be prepared from an adhesive which is mainly composed of denatured methacrylate such as polyurethane methacrylate, alkyl methacrylate or polyglycol methacrylate, with addition of a peroxide, a sensitizer, a stabilizer and the like.

Specific examples according to the present invention are described in the following.

The adhesives used in the examples were prepared from ultraviolet setting type anaerobic resin and carbon particles of 10 μm in mean particle diameter. As shown in Table 1, the contents of the carbon particles were varied in a range of 0.05 to 2.0 percent by weight.

The ultraviolet setting type anaerobic resin was prepared from polyester urethane dimethacrylate as a polyurethane methacrylate, bisphenol-A-dimethacrylate as an alkyl methacrylate, tetraethylene glycol dimethacrylate as a polyglycol methacrylate, cumene hydroperoxide as a peroxide, benzophenone as a sensitizer, p-benzoquinone as a stabilizer, and benzoic sulfimide as an accelerating agent. In this ultraviolet setting type anaerobic resin, the ultraviolet setting property is attained by a chain reaction of methacrylates and radicals produced from the sensitizer, while the anaerobic setting property is attained by a chain reaction of methacrylates and radicals produced from the peroxide.

These adhesives were employed for compression-bonding vibrating plates to piezoelectric substrates, and then set. A heat cycle test was made on the samples, obtained to measure conductivity values and evaluate characteristics. The heat cycle test was carried out by repeating 500 heat cycles at −55° C. for 30 minutes and +85° C. for 30 minutes.

Further, ultraviolet setting properties were evaluated as to portions of the adhesion layers forced out beyond the piezoelectric substrates of the samples. Ultraviolet radiation having a dominant wavelength of 365 nm and integrating luminous energy of about 2 J was emitted from an Hg lamp of 80 W/cm and applied to the samples, to thereafter evaluate tackiness with a finger touch. The term "tacky" appearing in Table 1 means that tackiness resulted from incomplete setting.

Table 1 shows the results of ultraviolet setting properties and conductivity values evaluated and measured after the heat cycle test.

TABLE 1

| Measurement | Content of Carbon Particles (% by weight) | | | | | |
|---|---|---|---|---|---|---|
| Item | 0.0 | 0.05 | 0.1 | 0.5 | 1.0 | 2.0 |
| Ultraviolet Setting Property | good | good | good | good | good | tacky |
| Conductivity After Heat Cycle | no good | no good | good | good | good | good |

It is clearly understood from the results shown in Table 1 that, when the adhesives contained at least 0.1 percent by weight of carbon particles, the vibrating plates were still maintained in excellent conduction with the piezoelectric substrates after the heat cycle test. When the content of carbon particles was in excess of 2.0 percent by weight, however, the ultraviolet setting property of the ultraviolet setting type anaerobic adhesive was extremely reduced due to an effect of coloring by the carbon particles. In particular, it was difficult to set a portion of the adhesive forced out beyond the piezoelectric substrate with ultraviolet radiation. According to the present invention, therefore, a suitable content of the carbon particles in the ultraviolet setting type anaerobic adhesive is in a range of 0.1 to 1.0 percent by weight. With such a range of the content of the carbon particles, it is possible to maintain conduction between the vibrating plate and the piezoelectric substrate with no reduction in adhesion of the ultraviolet setting type anaerobic adhesive. According to the present invention, a more preferable content of the carbon particles is in a range of 0.3 to 0.8 percent by weight.

According to an experiment made by the inventors, it has been proved difficult to attain complete conduction between the electrode film and the vibrating plate if the carbon particles contained in the ultraviolet setting type anaerobic adhesive are less than 1.0 μm in particle diameter. It has also been recognized that, if the carbon particles exceed 20.0 μm in particle diameter, the adhesion layer is excessively increased in thickness so asto deteriorate the resonance characteristic of the piezoelectric sounding body. Therefore, the carbon particles contained in the ultraviolet setting type anaerobic adhesive are preferably 1.0 to 20.0 μm in particle diameter. More preferably, the carbon particles are in a range of 3.0 to 10.0 μm in particle diameter.

The particle diameter was measured by laser-diffraction type of particle-size distribution measuring apparatus and calculated from the following equation.

$$MV = \frac{\Sigma(V_i \times d_1)}{\Sigma V_i}$$

wherein MV denotes volume mean particle diameter; $V_i$ denotes volume rate in each particle diameter section; and $d_i$ denotes central diameter in each particle diameter section.

Since the adhesion layer is conductive, the portion forced out beyond the piezoelectric substrate may cause a short across the electrode films provided on both surfaces of the piezoelectric substrate. According to the present invention, however, the adhesion layer containing carbon particles is adapted to allow conduction between nonadhesive substances upon compression and setting, and the portion of the adhesion layer that is forced out beyond the piezoelectric substrate still maintains a sufficient insulation property after the same is set with ultraviolet radiation. When the amount of the carbon particles contained in the adhesive is not more than 1.0 percent by weight, the ultraviolet setting type anaerobic resin exhibits volume resistivity of at least $1.0 \times 10^{14}$ Ω cm after ultraviolet setting. Thus, the portion of the adhesion layer forced out beyond the piezoelectric substrate causes no short across the electrode films.

The ultraviolet setting anaerobic adhesive may contain a conductive material other than carbon particles. However, metal particles forming a general conductive material are extremely larger in specific gravity than the ultraviolet setting type anaerobic adhesive. When the adhesive contains another conductive material such as metal particles, therefore, such metal particles sediment with time to disable homogeneous dispersion and mixing in the adhesive. Thus, it is necessary to stir the ultraviolet setting type anaerobic adhesive for every bonding operation, to homogeneously disperse the metal particles again. This leads to an extremely troublesome bonding operation.

On the other hand, carbon particles are substantially equivalent in specific gravity to the ultraviolet setting type anaerobic adhesive, and hardly cause sedimentation in the adhesive. When such carbon particles are employed, therefore, the same may simply be homogeneously dispersed and mixed in the adhesive in the initial stage, so as to require no troublesome operation such as dispersion and mixing.

While the above embodiment has been described with reference to electrode films of Ni sputtering films, the present invention is not restricted to such films but the electrode films may be formed by vacuum deposition, for example.

In the present invention, an electrode film may be a conventional electrode film with irregular surface which is mainly made by baking a layer of silver. Furthermore, its surface may be made flat by grinding or the like. In other words, the present invention can effectively apply to a piezoelectric substrate which has an electrode film with any surface condition.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A piezoelectric sounding body comprising:
a piezoelectric substrate;
an electrode film provided on a surface of said piezoelectric substrate;
a vibrating plate provided on said electrode film; and
an adhesion layer provided between said electrode film and said vibrating plate for allowing electrical conduction between said electrode film and said vibrating plate,
said adhesion layer being formed of an ultraviolet setting type anaerobic adhesive containing 0.1 to 1.0 percent by weight of carbon particles of 1.0 to 20.0 μm in means particle diameter.

2. A piezoelectric sounding body in accordance with claim 1, wherein said piezoelectric substrate is prepared from a polarized piezoelectric ceramic substrate.

3. A piezoelectric sounding body in accordance with claim 1, wherein said ultraviolet setting type anaerobic adhesive comprises at least one type of denatured methacrylate selected from the group consisting of polyurethane methacrylate, alkyl methacrylate and polyglycol methacrylate.

4. A piezoelectric sounding body in accordance with claim 1, wherein said electrode film is a film formed by sputtering.

5. A piezoelectric sounding body in accordance with claim 4, wherein said film formed by sputtering is a Ni sputtering film.

6. A piezoelectric sounding body in accordance with claim 1, wherein said electrode film is a film formed by vacuum deposition.

7. A piezoelectric sounding body in accordance with claim 1, wherein said carbon particles are 3.0 to 10.0 μm in mean particle diameter.

8. A piezoelectric sounding body in accordance with claim 1, wherein the content of said carbon particles is 0.3 to 0.8 percent by weight.

9. A piezoelectric sounding body in accordance with claim 1, wherein said electrode film is a film which is mainly made of silver by baking.

10. A piezoelectric sounding body in accordance with claim 9, wherein said film has an irregular surface.

11. A piezoelectric sounding body in accordance with claim 9, wherein said film has a flat surface.

* * * * *